United States Patent [19]

Mei

[11] 3,965,367
[45] June 22, 1976

[54] MULTIPLE OUTPUT LOGIC CIRCUITS

[75] Inventor: Kenyon Chi-Yen Mei, Union City, Calif.

[73] Assignee: Hewlett-Packard Company, Palo Alto, Calif.

[22] Filed: May 5, 1975

[21] Appl. No.: 574,203

[52] U.S. Cl. .............................. 307/207; 307/205; 307/215
[51] Int. Cl.² ................ H03K 19/08; H03K 19/12; H03K 19/20
[58] Field of Search .......... 307/205, 207, 211, 215, 307/304, 202

[56] References Cited
UNITED STATES PATENTS

| | | | |
|---|---|---|---|
| 3,381,117 | 4/1968 | Forslund et al. | 307/207 X |
| 3,458,240 | 7/1969 | Hanson | 307/207 X |
| 3,540,016 | 11/1970 | Guterman et al. | 307/211 X |
| 3,702,446 | 11/1972 | Steudel | 307/205 X |
| 3,825,772 | 7/1974 | Ainsworth | 307/205 X |
| 3,855,536 | 12/1974 | Neuner | 307/207 X |
| 3,900,742 | 8/1975 | Hampel et al. | 307/211 |

OTHER PUBLICATIONS

Buelow, et al., "Combining Logical Circuits", *IBM Tech. Discl. Bull.*, vol. 2, no. 2, p. 48, 8/1959.

*Primary Examiner*—John S. Heyman
*Assistant Examiner*—L. N. Anagnos
*Attorney, Agent, or Firm*—David A. Boone

[57] ABSTRACT

A circuit provides multiple output switching functions. Diodes couple groups of switching elements to form a single complex circuit. The diodes provide isolation between each group so that the logical function of each group may be output, as well as the logical function provided by the coaction of the groups. The present invention is particularly useful in circuits using complementary switching elements, e.g., Complementary Metal Oxide Semiconductor (CMOS) and Silicon on Sapphire (SOS) integrated logic circuits.

3 Claims, 3 Drawing Figures

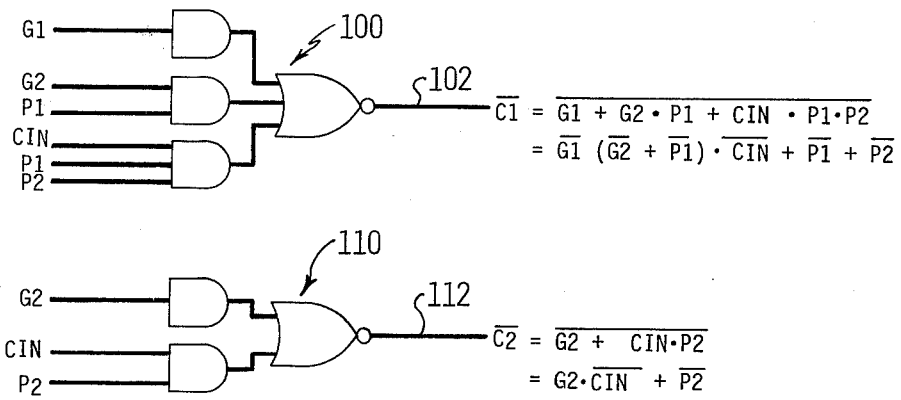
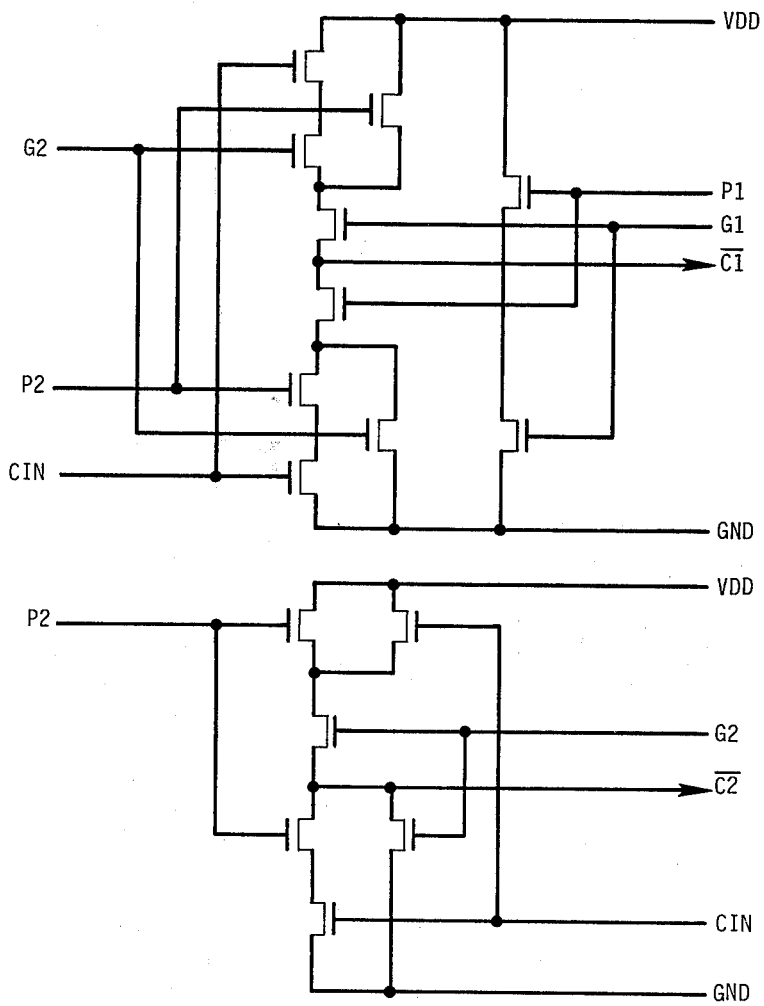
FIGURE 1
FIGURE 2

MULTIPLE OUTPUT LOGIC CIRCUITS

BACKGROUND AND SUMMARY OF THE INVENTION

Many past efforts have attempted to minimize the elements required to produce a particular logic function. Successful efforts were characterized by using a minimum number of logic gates. Also, efforts have been made to produce logic gates which require a minimum number of basic switching elements and a minimum chip area on an integrated circuit.

The present invention is directed towards optimizing both of the above desires. The number of logic gates and the number of switching elements are simultaneously minimized in cases where similar logic outputs are required. Wasteful duplication of logic gates and switching elements is prevented in those cases where the separate optimization of the number of logic gates required and the number of switching elements required for each logic gate do not result in the optimum solution for a particular circuit, i.e., the minimum number of switching elements in the entire circuit. This is most often true in Large Scale Integration (LSI).

DESCRIPTION OF THE DRAWINGS

FIG. 1 is a logic diagram of a dual output anticipated carry circuit.

FIG. 2 shows a conventional CMOS circuit for the logic circuit shown in FIG. 1.

DESCRIPTION OF THE PREFERRED EMBODIMENT

Figure 3:
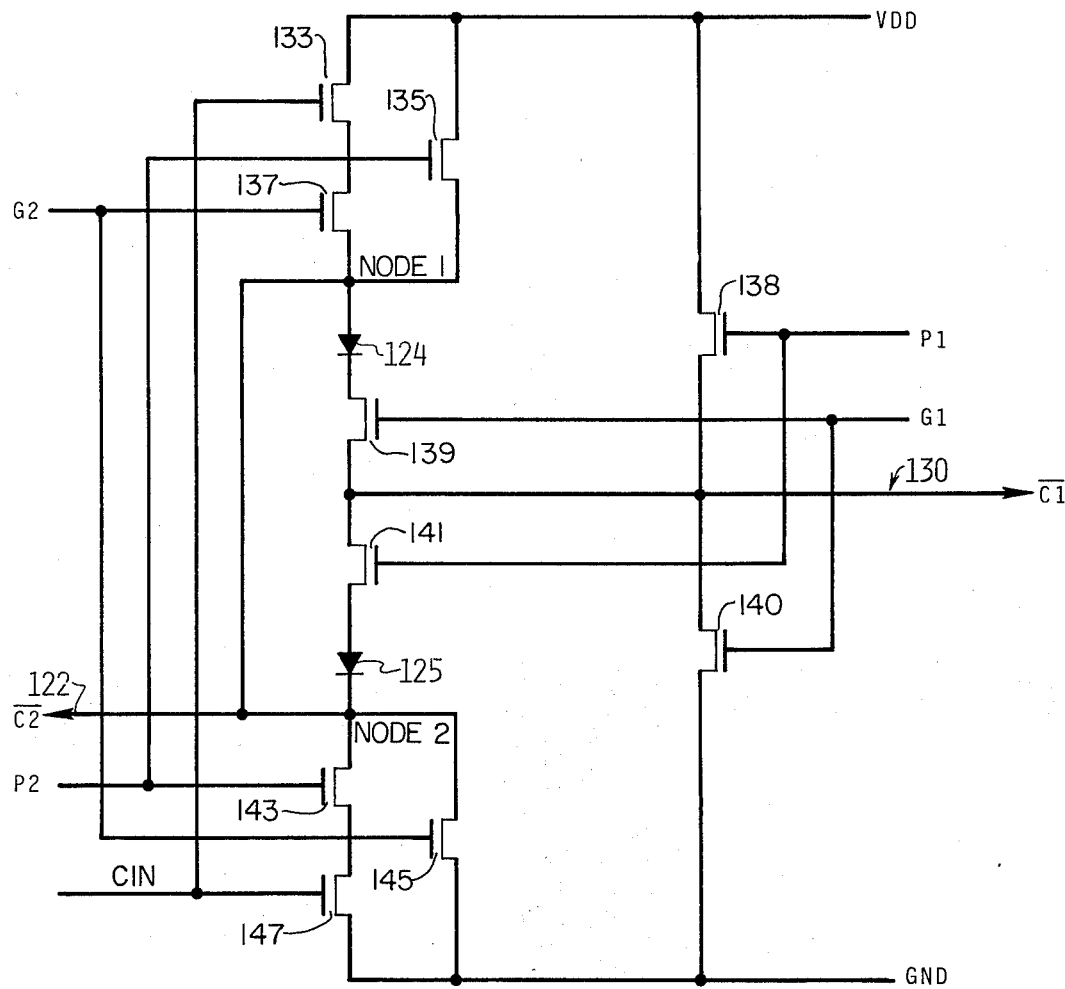
FIG. 3 shows the use of the present invention to construct the circuit in FIG. 1 using CMOS technology.

Referring to the logic diagram of FIG. 1, a circuit 100 is shown which provides a signal on line 102 representing the logical function $\overline{C1} = \overline{G1 + G2 \cdot P1 + C1N \cdot P1 \cdot P2}$. Using de Morgan's theorem these equations may also be written as shown below.

$$\begin{aligned}
\overline{C1} &= \overline{G1 + G2 \cdot P1 + C1N \cdot P1 \cdot P2} \\
&= \overline{G1} \cdot (\overline{G2} + \overline{P1}) \cdot (\overline{C1N} + \overline{P1} + \overline{P2}) \\
\overline{C2} &= \overline{G2 + C1N \cdot P2} \\
&= \overline{G2} \cdot (\overline{C1N} + \overline{P2})
\end{aligned} \quad (1)(2)$$

Using conventional methods, there does not appear any way to further reduce the number of gates required to provide these two logic functions. Therefore, this logic circuit would probably be provided in a CMOS integrated circuit similar to that shown in FIG. 2.

However, using the present invention, signals may be provided representing both logic functions with a substantial decrease in the number of switching elements required. Other advantages are a reduction in the chip area required, an increase in reliability of the circuit because fewer elements are therein, and related cost savings.

Referring to FIG. 3, there is shown the logic circuit of the preferred embodiment. This circuit comprises the circuit shown at the top of FIG. 2 for providing the signal $\overline{C1}$, but further includes diodes 124 and 125 and an electrical shorting path added between nodes 1 and 2. Note that the signal $\overline{C2}$ on line 122 is provided by simply shorting node 1 to node 2. However, the shorting of node 1 to node 2 creates possible electrical conductive paths between power supply voltage $V_{DD}$ and ground, e.g., from $V_{DD}$ through field effect transistors (FET's) 138, 139 and 145 to ground if diode 124 were not in place, or through FET's 135, 141 and 140 if diode 125 were not in place. Hence the diodes are added to block these conductive paths between power and ground.

Some apparent conducting paths are not a problem because they were a part of the original design, e.g., $V_{DD}$ through FET's 138 and 140 to ground. This path is not a problem because a known property of the operating environment of this circuit is that signal G1 is never high when signal P1 is low, and FET's 138 and 140 are therefore never in the conducting state simultaneously.

I claim:

1. A logic circuit comprising a plurality of complementary switching elements, a first portion of said plurality of complementary switching elements having at least one interconnecting node and coupled between a primary output line and a first power supply line, a second portion of said plurality of complementary switching elements having at least one interconnecting node and being coupled between said primary output line and a second power supply line;
   an electrical shorting path between the interconnecting node of said first portion of said plurality of complementary switching elements and the interconnecting node of said second portion of said plurality of complementary switching elements;
   a secondary output line coupled to said electrical shorting path; and
   one or more diodes coupled to said first and second interconnecting nodes for preventing electrical conduction between said first power supply line and said second power supply line via said electrical shorting path and one or more of the plurality of complementary switching elements.

2. The logic circuit as in claim 1 wherein said one or more diodes comprises a first diode coupled between said first interconnecting node and said primary output line, an anode of said first diode being coupled to said first interconnecting node, and a second diode coupled to the second interconnecting node, the cathode of said second diode being coupled to said second interconnecting node.

3. A method for providing secondary output signals from a logic circuit comprising a plurality of complementary switching elements, a first portion of said complementary switching elements being coupled between a primary output line and a first power supply line, a second portion of said complementary switching elements being coupled between said primary output line and a second power supply line, said method comprising the steps of:
   adding an electrical shorting path between an interconnecting node within said first portion of said complementary switching elements and an interconnecting node of said second portion of complementary switching elements;
   providing a secondary output line coupled to said electrical shorting path; and
   inserting one or more diodes to block conductive paths between said first power supply line and said second power supply line via said electrical shorting path and complementary switching elements which may be simultaneously in a conducting state.

\* \* \* \* \*